United States Patent
Lee et al.

(10) Patent No.: US 10,508,218 B2
(45) Date of Patent: Dec. 17, 2019

(54) WINDOW FILM AND DISPLAY INCLUDING THE SAME

(71) Applicant: SAMSUNG SDI CO., LTD., Yongin-si, Gyeonggi-do (KR)

(72) Inventors: Jung Hyo Lee, Uiwang-si (KR); Kyoung Ku Kang, Uiwang-si (KR); Sung Han Kim, Uiwang-si (KR); Joo Hui Kim, Uiwang-si (KR); Si Kyun Park, Uiwang-si (KR); Nak Hyun Sung, Uiwang-si (KR); Jin Hee Choi, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 17 days.

(21) Appl. No.: 14/830,708

(22) Filed: Aug. 19, 2015

(65) Prior Publication Data
US 2016/0053138 A1    Feb. 25, 2016

(30) Foreign Application Priority Data
Aug. 21, 2014    (KR) .......................... 10-2014-0109245

(51) Int. Cl.
   *C09J 7/22*       (2018.01)
   *C09D 183/06*    (2006.01)
   (Continued)

(52) U.S. Cl.
   CPC .............. *C09D 183/04* (2013.01); *C08K 3/11* (2018.01); *C08K 5/151* (2013.01); *C08K 5/23* (2013.01); *C08K 5/29* (2013.01); *C08K 5/32* (2013.01); *C09D 183/06* (2013.01); *C09J 7/22* (2018.01); *H01L 51/5237* (2013.01); *C08K 5/3415* (2013.01); *C09J 2201/122* (2013.01); *C09J 2203/318* (2013.01); *C09J 2205/102* (2013.01);
   (Continued)

(58) Field of Classification Search
   None
   See application file for complete search history.

(56) References Cited

U.S. PATENT DOCUMENTS 6,254,937 B1 *  7/2001  Schafheutle ....... C08G 18/0823
                                                    427/388.2
6,965,191 B2 * 11/2005  Koike .................... G02B 1/116
                                                    313/112
(Continued)

FOREIGN PATENT DOCUMENTS

JP     2010-060617 A     3/2010
JP     2010060617 A *    3/2010 ............... G02B 5/22
(Continued)

OTHER PUBLICATIONS

Machine translation of JP 2010060617 A (2010).*
Korean Office Action dated Jun. 22, 2017 in corresponding Korean Patent Application No. 10-2014-0109245 (5 pages).

*Primary Examiner* — Frank D Ducheneaux
(74) *Attorney, Agent, or Firm* — Lewis Roca Rothgerber Christie LLP

(57) ABSTRACT

A window film includes a base layer and a coating layer formed on the base layer. The coating layer contains a silicone resin, and the window film contains a dye having a maximum absorption wavelength of about 500 nm to about 650 nm. A display includes the window film, and may be a flexible display.

11 Claims, 2 Drawing Sheets

(51) Int. Cl.

| | |
|---|---|
| *C09D 183/04* | (2006.01) |
| *C08K 5/3415* | (2006.01) |
| *C08K 5/29* | (2006.01) |
| *C08K 5/23* | (2006.01) |
| *C08K 5/32* | (2006.01) |
| *C08K 5/151* | (2006.01) |
| *C08K 3/11* | (2018.01) |
| *H01L 51/52* | (2006.01) |

(52) U.S. Cl.
CPC .... *C09J 2205/106* (2013.01); *C09J 2425/006* (2013.01); *C09J 2433/006* (2013.01); *C09J 2467/006* (2013.01); *C09J 2469/006* (2013.01); *C09J 2479/086* (2013.01); *H01L 2251/5338* (2013.01)

(56) References Cited

U.S. PATENT DOCUMENTS

| | | | | |
|---|---|---|---|---|
| 2007/0298248 | A1* | 12/2007 | Hongo | C08J 7/047 428/333 |
| 2010/0157216 | A1* | 6/2010 | Wada | G02F 1/133606 349/122 |
| 2012/0263947 | A1* | 10/2012 | Ozawa | C09J 133/08 428/354 |

FOREIGN PATENT DOCUMENTS

| | | |
|---|---|---|
| KR | 10-2004-0097243 A | 11/2004 |
| KR | 10-2007-0091033 A | 9/2007 |

\* cited by examiner

WINDOW FILM AND DISPLAY INCLUDING THE SAME

CROSS-REFERENCE TO RELATED APPLICATION

This application claims priority to and the benefit of Korean Patent Application 10-2014-0109245, filed August 21, 2014 in the Korean Intellectual Property Office, the entire content of which is incorporated herein by reference.

BACKGROUND

1. Technical Field

Embodiments of the present invention relate to a window film and a display including the same.

2. Description of the Related Art

A display, such as a liquid crystal display, an organic light emitting diode display and the like, includes a window film on its outermost side. The window film serves to protect the screen of the display and to protect the display from external impact. Glass substrates have been used as the window film. However, glass substrates are heavy and cannot be applied to a flexible display, despite their good hardness properties. Recently, instead of such glass substrates as the window film, research has been conducted into the development of plastic films, which can be folded and unfolded, can be bent, have elasticity enabling restoration to their original shape even after being bent, and can be rolled up.

SUMMARY

In accordance with embodiments of the present invention, a window film may include a base layer and a coating layer formed on the base layer, and may contain a dye having a maximum absorption wavelength of about 500 nm to about 650 nm. The coating layer may be formed of a composition including a silicone resin.

In accordance with embodiments of the present invention, a display may include the window film as set forth herein.

DETAILED DESCRIPTION

Figure 1:
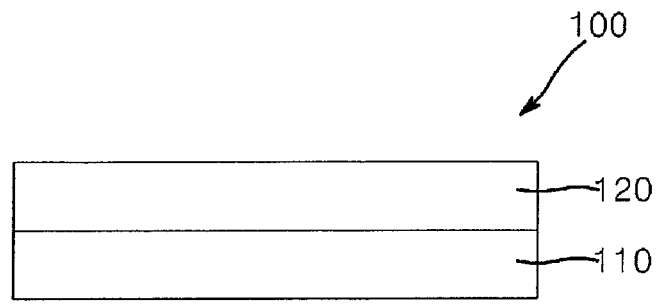
FIG. 1 is a schematic cross-sectional view of a window film according to embodiments of the present invention.

Embodiments of the present invention are described with reference to the accompanying drawings. It is understood that the present invention is not limited to the following embodiments and may be embodied in different ways. In the drawings, portions irrelevant to the description are omitted for clarity. Like components are denoted by like reference numerals throughout the specification.

As used herein, terms such as "upper side" and "lower side" are defined with reference to the accompanying drawings. Thus, it is understood that the term "upper side" can be used interchangeably with the term "lower side". It is understood that when an element such as a layer, film, region or substrate is referred to as being placed "on" another element, it can be directly placed directly on the other element, or intervening layer(s) may be present. On the other hand, when an element is referred to as being placed "directly on" another element, there are no intervening layer(s) therebetween.

As used herein, the term "(meth)acryl" may refer to acryl and/or methacryl.

As used herein, the term "radius of curvature" refers to a minimum radius of a jig for radius of curvature testing (mandrel bending tester, Coretech Co., Ltd.), which allows a specimen to not suffer from cracking when the specimen prepared by cutting a window film to a size of 3 cm×15 cm (width×length) is wound around the jig, kept wound for 5 seconds, unwound, and then observed as to whether the specimen suffers from cracking. Here, when the specimen is wound, the compressive direction is defined as the direction in which the coating layer of the window film is brought into contact with a surface of the jig, and the tensile direction is defined as the direction in which the base layer of the window film is brought into contact with the jig.

Hereinafter, a window film according to embodiments of the present invention is described with reference to FIG. 1. FIG. 1 is a schematic cross-sectional view of a window film according to one embodiment of the present invention.

Referring to FIG. 1, a window film 100 according to embodiments of the invention may include a base layer 110 and a coating layer 120 formed on the base layer 110, and may contain a dye (not shown in FIG. 1).

The window film 100 may include the dye to reduce the yellowness index of the window film, and to prevent (or reduce) any visible yellowing. Specifically, since window films (which includes a plastic substrate instead of a glass substrate, and includes a coating layer formed of a curable resin) typically have high yellowness indices, yellow color can be visible to the naked eye at the front and/or lateral sides of the window film. However, the window film 100 according to embodiments of the present invention may have a low (e.g., a reduced) yellowness index, and thus may prevent (or reduce) visible yellowing. For example, the window film 100 according to embodiments of the present invention may have a yellowness index of about 4.0 or lower, for example, about 0.1 to about 3.5. Within these ranges, the window film 100 can prevent (or reduce) visible yellowing when applied to a display.

The window film 100 may exhibit good transparency despite the presence of the dye, and thus can be used as a window film. For example, the window film 100 may have a haze of about 3% or less, for example, about 0.1% to about 2%, at a wavelength of 380 nm to 750 nm. The window film 100 may have a total light transmittance of about 85% or greater, for example, about 88% to about 99%, at a wavelength of 380 nm to 750 nm. Within these ranges of haze and total light transmittance, the window film 100 can be applied to a display.

The window film 100 may have a thickness of about 50 µm to about 300 µm, for example, about 100 µm to about 200 µm. Within these ranges, the window film 100 can be used as a window film.

The coating layer 120 of the window film 100 may have a pencil hardness of about 6H or higher, for example, about 6H to about 9H. The window film 100 may have a radius of curvature in the compressive direction of about 10 mm or less, for example, about 1 mm to about 10 mm, and a radius of curvature in the tensile direction of about 10 mm or less, for example, about 1 mm to about 10 mm. Within these ranges, the window film 100 can have a low radius of curvature in both the compressive and tensile directions while exhibiting high hardness, and thus can be applied to a flexible display.

Hereinafter, the base layer 110 and the coating layer 120 are described.

The base layer 110 may improve the mechanical strength of the window film 100 by supporting the coating layer 120, and may be attached to a display device (for example, an organic light emitting device) via an adhesive layer (not shown in FIG. 1).

The base layer 110 may have a yellowness index of about 1 to about 9. Here, even though the base layer 110 may have a yellowness index of about 5 or greater, the yellowness index of the window film 100 can be reduced due to the coating layer 120 including the dye. The base layer 110 may be formed of an optically transparent and flexible resin. For example, the base layer 110 may be formed of at least one of a polyester resin (such as polyethylene terephthalate, polyethylene naphthalate, polybutylene terephthalate, polybutylene naphthalate resins or the like), polycarbonate resins, poly(meth)acrylate resins (such as polymethylmethacrylate resins or the like), polystyrene resins, and/or polyimide resins. In some embodiments, the base layer 110 may be formed of a polyimide resin. Thus, the base layer 110 can exhibit improved heat resistance, thereby imparting improved heat resistance to the window film 100. Although the base layer formed of a polyimide resin has a high yellowness index of about 5 to about 8, the window film 100 according to embodiments of the present invention may include the dye to reduce the overall yellowness index of the window film.

The window film 100 may have a thickness ratio of the base layer 110 to the coating layer 120 in a specified range to improve the mechanical strength of the window film 100 while also preventing (or reducing) visible yellowing. For example, the thickness ratio of the base layer 110 to the coating layer 120 (i.e., thickness of the base layer 110: thickness of the coating layer 120) ranges from about 1:1 to about 5:1, for example, about 1.5:1 to about 3:1. Within these ranges, the window film can exhibit improved mechanical strength and prevent (or reduce) yellowing. The base layer 110 may have a thickness of about 10 µm to about 200 µm, for example, about 20 µm to about 150 µm. Within these ranges, the base layer 110 can be used in the window film.

The coating layer 120 is disposed on the outermost side of the window film 100. The coating layer 120 may be formed on the base layer 110 and serves to protect the base layer 110 while also providing high hardness to the window film 100. In some embodiments, the coating layer 120 may be formed directly on the base layer 110. The expression, "formed directly on," means that there are no intervening layers (such as adhesive layers, bonding layers or the like) between the coating layer 120 and the base layer 110.

The coating layer 120 may include a dye having a maximum absorption wavelength of about 500 nm to about 650 nm, for example, about 550 nm to about 620 nm, which enables reduction in the yellowness index of the window film 100. The dye is included in the coating layer 120, but may also be included in other components in the window film, such as the base layer 110, adhesive layers, and/or the like. As used herein, the term "maximum absorption wavelength" refers to a wavelength corresponding to the maximum absorption peak, i.e., the wavelength corresponding to the maximum absorbance on an absorbance curve according to wavelength.

The dye may be disposed at any position in the coating layer 120. For example, the dye may be dispersed in the coating layer 120, or may be included in at least one layer of a coating layer that is composed of multiple layers of two or more layers (the multiple layers are not shown in FIG. 1).

The dye may be any suitable dye without limitation so long as the dye has a maximum absorption wavelength of about 500 nm to about 650 nm. For example, the dye may include at least one of a metal dye including a metal, and a non-metal dye not including metal (or including no metal). For example, the metal dye may include at least one complex of a metal such as vanadium, chromium, manganese or the like, but the dye is not limited thereto. For example, the metal dye may be a conjugated heterocyclic vanadium complex.

The non-metal dye may include any suitable dye not including a metal that has a maximum absorption wavelength of about 500 nm to about 650 nm, for example about 550 nm to about 620 nm. For example, the non-metal dye may include at least one of cyanine, porphyrin (including tetraazaporphyrin and the like), arylmethane, squarylium, azomethine, oxonol, azo, arylidene, xanthene, and merocyanine dyes, but the dye is not limited thereto.

A single metal and/or non-metal dye may be used, or a combination or mixture of two or more dyes may be included in the coating layer 120. The dye may be present in an amount of about 0.001% by weight (wt %) to about 5 wt %, for example, about 0.01 wt % to about 1 wt % based on 100 wt % of the coating layer 120. When the dye is included only in the coating layer 120, the dye may be present in an amount of about 0.001 wt % to about 5 wt %, for example, about 0.01 wt % to about 1 wt % in the coating layer 120. Even when the dye is included both in the coating layer 120 and in another component(s) in the window film, the dye may be present in an amount of about 0.001 wt % to about 5 wt %, for example, about 0.01 wt % to about 1 wt % in total based on 100 wt % of the coating layer 120. Within these ranges, the dye can minimize (or reduce) deteriorations in the transparency of the window film 100, and prevent (or reduce) visible yellowing of the window film 100.

The coating layer 120 may be formed of a composition for coating layers that includes the dye and a silicone resin, and thus can provide high hardness and flexibility.

The silicone resin may be cured to form a matrix of the coating layer and impart flexibility to the coating layer 120 while also improving the hardness of the coating layer 120. The silicone resin may include a siloxane resin containing a UV curable group. In some embodiments, the UV curable group may be an epoxy group, a (meth)acrylate group, a (meth)acrylamide group or a vinyl group, for example, an epoxy group. The siloxane resin containing the UV curable group may be prepared by transforming an alkoxysilane group (in part or in total) into a silanol group through hydrolysis of an organosilane containing a UV curable group and an alkoxysilane group, followed by condensation. For example, the organosilane containing the UV curable group and the alkoxysilane group may be represented by Formula 1, but is not limited thereto:

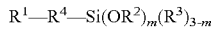  Formula 1

In Formula 1, $R^1$ is an epoxy group, a (meth)acrylate group, a (meth)acrylamide group, a vinyl group, a linear or branched $C_1$ to $C_6$ alkyl group containing an alicyclic epoxy group, a linear or branched $C_1$ to $C_6$ alkyl group containing a (meth)acrylate group, a linear or branched $C_1$ to $C_6$ alkyl group containing a (meth)acrylamide group, or a linear or branched $C_1$ to $C_6$ alkyl group containing a vinyl group. $R^2$ is a linear or branched $C_1$ to $C_{10}$ alkyl group. $R^3$ is a linear or branched $C_1$ to $C_{10}$ alkyl group, a $C_3$ to $C_{20}$ cycloalkyl group, a $C_6$ to $C_{20}$ aryl group, or a $C_7$ to $C_{20}$ arylalkyl group. $R^4$ is a single bond or a $C_1$ to $C_{10}$ alkylene group, and m is an integer of 1 to 3. In Formula 1, the term "alicyclic epoxy group" refers to a structure in which a $C_3$ to $C_6$ cycloalkyl group includes an epoxy group, and the term "single bond" means that $R^1$ and Si are directly connected without $R^4$ in Formula 1.

For example, the organosilane represented by Formula 1 may include at least one of 2-(3,4-epoxycyclohexyl)ethyltrimethoxysilane, 2-(3,4-epoxycyclohexyl)ethyltriethoxysilane, (meth)acryloxypopyltrimethoxysilane, (meth)acryloyloxypropyltriethoxysilane, and/or vinyltrimethoxysilane, but the organosilane is not limited thereto. For example, $R^1$ in Formula 1 may be a linear or branched $C_1$ to $C_6$ alkyl group containing an alicyclic epoxy group.

An alkoxysilane group is transformed (in part or total) into a silanol group by hydrolysis of the organosilane containing the UV curable group and alkoxysilane group, followed by formation of a siloxane bond through condensation of the silanol group, thereby preparing the siloxane resin containing the UV curable group.

Hydrolysis and condensation are generally known to those skilled in the art. For example, hydrolysis and condensation may be performed by mixing the organosilane containing the UV curable group and alkoxysilane group with a suitable solvent, and a catalyst may be further introduced to adjust the reaction rate. The catalyst may include any suitable catalyst, such as: acid catalysts (such as hydrochloric acid, acetic acid, hydrogen fluoride, nitric acid, sulfuric acid, chlorosulfonic acid, iodic acid, or the like); basic catalysts (such as ammonia, potassium hydroxide, sodium hydroxide, barium hydroxide, imidazole, or the like); and ion exchange resins (such as Amberite IRA-400, IRA-67, or the like). Hydrolysis and condensation may be performed at room temperature for about 12 hours to about 7 days. To promote the reaction, hydrolysis and condensation may be performed at about 60° C. to about 100° C. for about 2 hours to about 72 hours, but the reaction conditions are not limited thereto. For example, the solvent may include water, methanol, ethanol, propanol, isopropanol, n-butanol, tert-butanol, and/or methoxypropanol. A single solvent may be used, or a combination or mixture of solvents may be used.

Although the siloxane resin containing the UV curable group may be prepared by hydrolysis and condensation of the organosilane containing the UV curable group and alkoxysilane group alone, in some embodiments, the siloxane resin containing the UV curable group may also be prepared by hydrolysis and condensation of the organosilane containing the UV curable group and alkoxysilane group in conjunction with an organosilane containing a heterogeneous alkoxysilane group. For example, the organosilane containing the heterogeneous alkoxysilane group may be represented by Formula 2, but is not limited thereto:

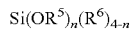   Formula 2

In Formula 2, $R^5$ is a linear or branched $C_1$ to $C_{10}$ alkyl group. $R^6$ is a $C_1$ to $C_{20}$ alkyl group, a $C_3$ to $C_8$ cycloalkyl group, a $C_2$ to $C_{20}$ alkenyl group, a $C_2$ to $C_{20}$ alkynyl group, a $C_6$ to $C_{20}$ aryl group, a halogen, a $C_1$ to $C_{10}$ alkyl group containing a halogen, an amino group, a $C_1$ to $C_{10}$ alkyl group containing an amino group, a mercapto group, a $C_1$ to $C_{10}$ ether group, a carbonyl group, a carboxylic acid group, or a nitro group. Also, n is an integer of 1 to 4. In Formula 2, the term "halogen" refers to fluorine, chlorine, iodine, or bromine. For example, the compound represented by Formula 2 may include at least one of tetramethoxysilane, tetraethoxysilane, methyltrimethoxysilane, methyltriethoxysilane, methyltripropoxysilane, dimethyldimethoxysilane, dimethyldiethoxysilane, phenyltrimethoxysilane, diphenyldimethoxysilane, diphenyldiethoxysilane, triphenylmethoxysilane, triphenylethoxysilane, ethyltriethoxysilane, propylethyltrimethoxysilane, 3-aminopropyltrimethoxysilane, 3-aminopropyltriethoxysilane, chloropropyltrimethoxysilane, and/or chloropropyltriethoxysilane.

The siloxane resin containing the UV curable group may include at least one of an M unit, a D unit, a T unit, and/or a Q unit. For example, the siloxane resin containing the UV curable group may include the T unit alone, or both the T unit and the M unit, thereby improving the flexibility of the coating layer 120. The terms "M unit," "D unit," "T unit," and "Q unit" are known to those of skill in the siloxane art, and are used herein in their art recognized sense.

The siloxane resin containing the UV curable group may have a weight average molecular weight of about 1,000 to about 15,000. The siloxane resin containing the UV curable group may have a polydispersity index (PDI) of about 1.0 to about 3.0. Within these ranges, it is possible to achieve high hardness and transparency through dense crosslinking of a siloxane network.

The composition for the coating layer may further include a curable monomer and an initiator in addition to the dye and the silicone resin.

The curable monomer can improve the hardness of the coating layer by crosslinking with the silicone resin, and can improve processability by controlling the viscosity of the composition. For example, the curable monomer may include at least one of an epoxy, an acid anhydride, and/or an oxetane monomer. The epoxy monomer can form a matrix of the coating layer by curing together with the silicone resin, and can improve the hardness of the coating layer by improving the degree of crosslinking of the coating layer. The epoxy monomer may include a photocurable monomer containing at least one epoxy group, and the epoxy group may include epoxy groups and organic groups containing an epoxy group, for example, glycidyl groups. The epoxy monomer may include alicyclic, aromatic, aliphatic, hydrogenated epoxy monomers, and mixtures thereof. The alicyclic epoxy monomer is a monomer in which a $C_3$ to $C_{10}$ alicyclic ring has at least one epoxy group. For example, the alicyclic epoxy monomer may include 3,4-epoxycyclohexylmethyl-3',4'-epoxycyclohexane carboxylate, but is not limited thereto. The aromatic epoxy monomer may include bisphenol A, bisphenol F, phenol novolac, cresol novolac, a glycidyl ether of triphenylmethane, tetraglycidyl methyleneaniline, and/or the like. The aliphatic epoxy monomer may include 1,4-butanediol diglycidyl ether, 1,6-hexanediol diglycidyl ether, and/or the like. The hydrogenated epoxy monomer may be obtained by hydrogenation of an aromatic epoxy monomer, and may include hydrogenated bisphenol A diglycidyl ether and/or the like. The acid anhydride monomer may include at least one of phthalic anhydride, tetrahydrophthalic anhydride, hexahydrophthalic anhydride, methyl nadic anhydride, chlorendic anhydride, and/or pyromellitic anhydride. The oxetane monomer may include at least one of 3-methyloxetane, 2-methyloxetane, 3-oxetanol, 2-methyleneoxetane, 3,3-oxetanedimethanethiol, 4-(3-methyloxetane-3-yl)benzonitrile, N-(2,2-dimethylpropyl)3-methyl-3-oxetanemethaneamine, N-(1,2-dimethylbutyl)-3-methyl-3-oxetanemethaneamine, (3-ethyloxetane-3-yl) methylmethacrylate, 3-ethyl-3-hydroxymethyl-oxetane, 2-ethyloxetane, xylene bis-oxetane, and/or 3-ethyl-3-[[(3-ethyloxetane-3-yl)methoxy]methyl]oxetane.

The initiator may facilitate formation of the matrix of the coating layer by curing the silicone resin and the curable monomer, and may include at least one of a photocationic initiator, a cationic thermal initiator, and a photoradical initiator. The photocationic initiator may include a cation and an anion making a salt. Examples of the cation may include: diaryliodonium (such as diphenyliodonium, 4-methoxydiphenyliodonium, bis(4-methylphenyl)iodonium, (4-methylphenyl)[4-(2-methylpropyl)phenyl]iodonium, bis(4-tert-butylphenyl)iodonium, bis(dodecylphenyl)iodonium, or the like); triarylsulfonium (such as triphenylsulfonium, diphenyl-4-thiophenoxyphenylsulfonium, or the like); bis[4-(diphenylsulfonio)phenyl]sulfide; bis[4-(di(4-(2-hydroxyethyl)phenyl)sulfonio)-phenyl]sulfide; (η5-2,4-cyclopentadien-1-yl)[(1,2,3,4,5,6-η)-(1-methylethyl)benzene]iron(1+), or the like.

Examples of the anion may include tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($SbCl_6^-$), or the like.

The cationic thermal initiator may include 3-methyl-2-butenyltetramethylenesulfonium, ytterbium, samarium, erbium, dysprosium, lanthanum, tetrabutylphosphonium, ethyltriphenylphosphonium bromide salts, benzyldimethylamine, dimethylaminomethylphenol, triethanolamine, N-n-butylimidazole, 2-ethyl-4-methylimidazole, or the like. Examples of the anion may include tetrafluoroborate ($BF_4^-$), hexafluorophosphate ($PF_6$), hexafluoroantimonate ($SbF_6^-$), hexafluoroarsenate ($AsF_6^-$), hexachloroantimonate ($SbCl_6^-$), or the like.

The photoradical initiator may catalyze the curing reaction by generating radicals through light irradiation, and may include any suitable photoradical initiator. For example, the photoradical initiator may include at least one of phosphorus, triazine, acetophenone, benzophenone, thioxanthone, benzoin, and/or oxime photoradical initiators.

The composition for the coating layer may include about 65 wt % to about 95 wt % of the silicone resin, about 4 wt % to about 30 wt % of the curable monomer, about 0.1 wt % to about 10 wt % of the initiator, and about 0.001 wt % to about 5 wt % of the dye in terms of solid content. Within these ranges, the composition can improve the flexibility and hardness of the coating layer. The composition for the coating layer may have a viscosity at 25° C. of about 1 cPs to about 3000 cPs. Within this range, the composition for the coating layer can exhibit good coatability and wettability, thereby facilitating formation of the coating layer. As used herein, the expression, "in terms of solid content," refers to the listed amounts (i.e., weight percentages) being based on the remainder of the solids in the composition for the coating layer, and excludes any amount (or weight percentage) of the solvent.

The composition for the coating layer may further include a suitable additive. The additive may include at least one of an antistatic agent, leveling agent, antioxidant, stabilizer, and/or colorant.

The coating layer 120 may have a thickness of about 5 μm to about 200 μm, for example, about 10 μm to about 100 μm. Within these ranges, the coating layer 120 can be used for the window film 100.

Although not shown in FIG. 1, the coating layer 120 may also be formed on a lower side of the base layer 110, or on both the upper and lower sides of the base layer 110. In addition, although not shown in FIG. 1, a surface treatment layer (such as an antireflective layer, anti-glare layer, hard coating layer, and/or the like) may be further formed on the other side of the coating layer 120 to provide additional functions to the window film 100. Also, an adhesive layer may be further formed on the other side of the base layer 110 to adhere the window film to a display device (for example, an organic light emitting device). In some embodiments, the adhesive layer may be formed of a composition for adhesive layers, which includes a (meth)acrylic resin, a crosslinking agent, a photoinitiator and a silane coupling agent.

Figure 2:
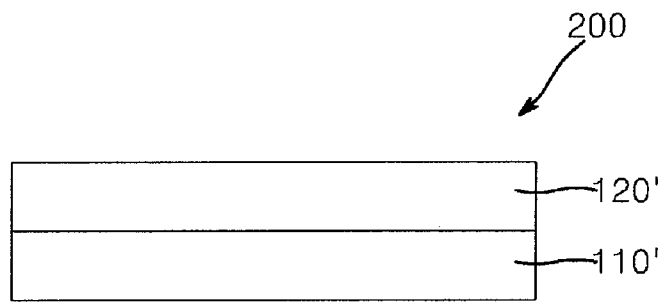
FIG. 2 is a schematic cross-sectional view of a window film according to embodiments of the present invention.

Hereinafter, a window film according to embodiments of the present invention is described with reference to FIG. 2. FIG. 2 is a schematic cross-sectional view of a window film according to embodiments of the present invention.

Referring to FIG. 2, a window film 200 may include a base layer 110' and a coating layer 120' formed on the base layer 110'. The coating layer 120' may be formed of a composition including a silicone resin. The base layer 110' may include a dye (not shown in FIG. 2) having a maximum absorption wavelength of about 500 nm to about 650 nm, for example, about 550 nm to about 620 nm. As a result, any yellow color of the base layer 110' and/or the coating layer 120' is canceled out (or reduced) by the dye, thereby reducing the yellowness index of the window film 200. The window film 200 depicted in FIG. 2 is substantially the same as the window film 100 discussed above in connection with FIG. 1 except that the dye is included in the base layer 110' instead of the coating layer 120'. In some embodiments, the dye may also be included in other components in the window film, such as the coating layer 120', adhesive layers (not shown in FIG. 2), and/or the like.

The dye may be present in the base layer in an amount of about 0.001 wt % to about 5 wt %, for example, about 0.01 wt % to about 1 wt % based on 100 wt % of the base layer 110'. When the dye is included both in the base layer 110' and in other components in the window film 200, the dye may be present in an amount of about 0.001 wt % to about 5 wt %, for example, about 0.01 wt % to about 1 wt % in total based on 100 wt % of the base layer 110'. Within these ranges, the dye can minimize (or reduce) deteriorations in transparency of the window film 200 while also preventing (or reducing) visible yellowing of the window film 200.

Figure 3:
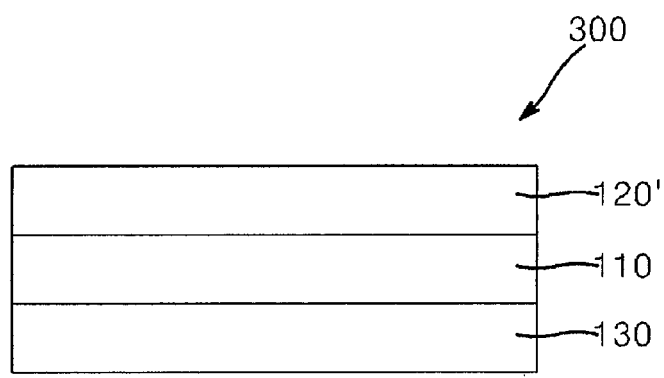
FIG. 3 is a schematic cross-sectional view of a window film according to embodiments of the present invention.
Figure 4:
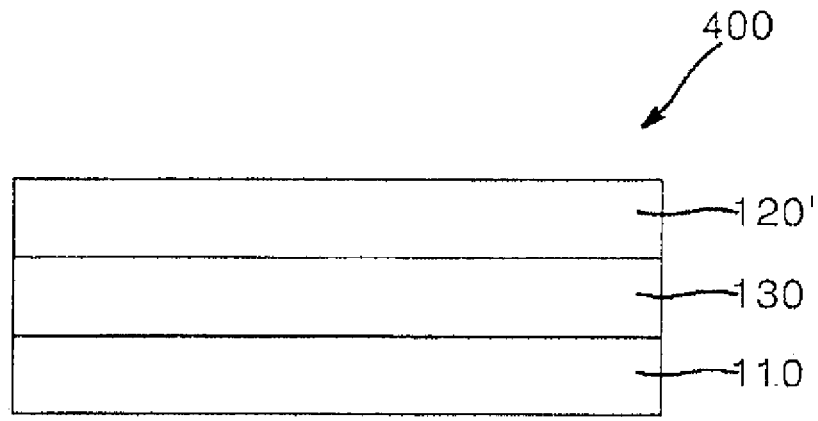
FIG. 4 is a schematic cross-sectional view of a window film according to embodiments of the present invention.

Hereinafter, window films according to embodiments of the present invention are described with reference to FIGS. 3 and 4. FIGS. 3 and 4 are schematic cross-sectional views of window films according to embodiments of the present invention.

Referring to FIG. 3, a window film 300 may include a base layer 110, a coating layer 120' formed on one surface of the base layer 110, and an adhesive layer 130 formed on the other surface of the base layer 110. Referring to FIG. 4, a window film 400 may include a base layer 110, an adhesive layer 130 on one surface of the base layer, and a coating layer 120' formed on a surface of the adhesive layer 130. The coating layer 120' may be formed of a composition including a silicone resin. The adhesive layer 130 may include a dye (not shown in FIG. 3) having a maximum absorption wavelength of about 500 nm to about 650 nm, for example, about 550 nm to about 620 nm. As a result, any yellow color of the base layer 110 and/or the coating layer 120' is canceled out (or reduced) by the dye, thereby reducing the yellowness index of the window film 300. In some embodiments, the dye may also be included in other components in the window film 300, such as the base layer 110, the coating layer 120', and/or the like.

The window films 300 and 400 depicted in FIGS. 3 and 4 are substantially the same as the window film 100 described above in connection with FIG. 1 except that the adhesive layer 130 is further formed on the window film 300, and the dye is included in the adhesive layer 130 instead of the coating layer 120'. Therefore, the adhesive layer 130 is described hereinafter.

The adhesive layer 130 may include the dye to reduce the yellowness index of the window film 300, and may be formed on the other surface of the base layer 110 to bond the window film 300 to a display device (for example, an organic light emitting device).

The adhesive layer 130 may be formed of a composition for adhesive layers, which includes an adhesive resin and a dye having a maximum absorption wavelength of about 500 nm to about 650 nm, for example, about 550 nm to about 620 nm. For example, the adhesive layer may be formed of a composition for preparing an optically clear adhesive (OCA). The adhesive resin may include any suitable adhesive resin. For example, the adhesive resin may include a (meth)acrylic resin, epoxy resin, urethane resin, and/or silicone resin, but the adhesive resin is not limited thereto.

The adhesive layer 130 may be formed of a composition for adhesive layers, which includes a (meth)acrylic resin, a crosslinking agent, a photoinitiator, a silane coupling agent, and a dye having a maximum absorption wavelength of about 500 nm to about 650 nm, for example, about 550 nm to about 620 nm. The (meth)acrylic resin may be a (meth)acrylic copolymer having an alkyl, hydroxyl, aromatic, carboxylic acid, alicyclic, or heteroalicyclic group, and may include any suitable (meth)acrylic copolymer. The crosslinking agent may be a polyfunctional (meth)acrylate, and may include: bifunctional (meth)acrylates (such as hexanediol diacrylate, or the like); trifunctional (meth)acrylates (such as trimethylolpropane tri(meth)acrylate); tetrafunctional (meth)acrylates (such as pentaerythritol tetra(meth) acrylate, or the like); pentafunctional (meth)acrylates (such as dipentaerythritol penta(meth)acrylate, or the like); hexafunctional (meth)acrylates (such as dipentaerythritol hexa (meth)acrylate, or the like), but the crosslinking agent is not limited thereto. The photoinitiator may be any suitable photoinitiator, and may include the photoradical initiators discussed above. The silane coupling agent may include a silicon compound containing an epoxy group, such as 3-glycidoxypropyl trimethoxysilane.

The dye may be present in an amount of about 0.001 wt % to about 5 wt %, for example, about 0.01 wt % to about 1 wt % based on 100 wt % of the adhesive layer 130. When the dye is included only in the adhesive layer 130, the dye may be present in an amount of about 0.001 wt % to about 5 wt %, for example, about 0.01 wt % to about 1 wt % in the adhesive layer 130. When the dye is included both in the adhesive layer 130 and in other components in the window film, the dye may be present in an amount of about 0.001 wt % to about 5 wt %, for example, about 0.01 wt % to about 1 wt % in total based on 100 wt % of the adhesive layer 130. Within these ranges, the dye can minimize (or reduce) deteriorations in transparency of the window film 300 while also preventing (or reducing) visible yellowing of the window film 300.

The adhesive layer 130 may have a thickness of about 10 nm to about 500 nm. Within this range, the adhesive layer 130 can be used for the window film.

Hereinafter, a method for manufacturing a window film according to embodiments of the present invention is described.

The method for manufacturing a window film may include coating a composition for a coating layer onto one surface of a base layer, and then curing the composition.

The base layer may be formed of an optically transparent and flexible resin, and in some embodiments, the base layer is the same as that described above in connection with the window film 100 of FIG. 1. In a method for manufacturing a window film 100 according to embodiments of the invention, the base layer may include a resin and a dye.

The composition for the coating layer may include a silicone resin, and may further include a curable monomer and an initiator. The composition for a coating layer may further include a solvent to improve the coatability of the composition. For example, the solvent may include methylethylketone, but is not limited thereto. The composition for the coating layer is described above in connection with the window film of FIG. 1. The composition for the coating layer may further include a dye.

A process of coating the composition for the coating layer onto the one surface of the base layer is not particularly limited, and may include bar coating, spin coating, dip coating, roll coating, flow coating, die coating, or the like.

Curing forms a matrix of a coating layer, is performed by curing the composition for the coating layer, and may include at least one of photocuring and/or thermal curing.

Photocuring may include irradiation with light having a wavelength of about 400 nm or lower at a dose of about 10 mJ/cm$^2$ to about 2000 mJ/cm$^2$. Thermal curing may include thermal curing at about 50° C. to about 200° C. for about 1 hour to about 120 hours. Curing may be performed only once or multiple times. For example, curing may be performed twice or more times to further improve the hardness of the window film.

After the composition for the coating layer is coated onto the base layer and before the composition is cured, the method may further include drying the composition for the coating layer. Drying may be performed at about 50° C. to about 150° C. for about 1 minute to about 60 minutes. Within this range, it is possible to reduce the surface roughness of the coating layer.

The method may further include coating a composition for an adhesive layer onto the other surface of the base layer. A process of coating the composition for the adhesive layer onto the other surface of the base layer is not particularly limited, and may include bar coating, spin coating, dip coating, roll coating, flow coating, die coating, or the like.

The composition for the adhesive layer may include any suitable adhesive resin. For example, the adhesive resin may include a (meth)acrylic, epoxy, urethane, or silicone resin, or the like. The composition for the adhesive layer may include the adhesive resin and a dye. The composition for the adhesive layer described above in connection with the window film 300 of FIG. 3.

The composition for the adhesive layer is coated onto the other surface of the base layer, followed by curing, thereby forming an adhesive layer. In addition, the curing may include at least one of photocuring and/or thermal curing.

Photocuring may include irradiation with light having a wavelength of about 400 nm or lower at a dose of about 10 mJ/cm$^2$ to about 2000 mJ/cm$^2$. Thermal curing may include heat treatment at about 50° C. to about 200° C. for about 1 hour to about 120 hours.

In some embodiments, the composition for the coating layer may be coated onto one surface of the base layer, and the composition for the adhesive layer may be coated onto the other surface of the base layer, followed by curing, thereby simultaneously forming the coating layer and the adhesive layer. Similarly, in some embodiments, the composition for the adhesive layer may be coated onto one surface of the base layer, and the composition for the coating layer may be coated onto the surface of the adhesive layer, followed by curing, thereby simultaneously forming the coating layer and the adhesive layer.

According to embodiments of the invention, a display may include the window film described above in connection with any one of FIGS. 1 through 4. For example, the display may include an organic light emitting diode display, or a liquid crystal display, but is not limited thereto.

According to embodiments of the invention, the display may be a flexible display. The flexible display may include a window film described above in connection with any one of FIGS. 1 through 4. The flexible display may include: a substrate; a member for apparatuses disposed on an upper side of the substrate; and the window film described above disposed on an upper side of the member for apparatuses. Here, the member for apparatuses may include organic light emitting diodes, liquid crystals, or the like. For example, the flexible display may include: a substrate; a member for apparatuses disposed on an upper side of the substrate; a touchscreen panel disposed on an upper side of the member for apparatuses; a polarizing plate disposed on an upper side of the touchscreen panel; and a window film disposed on an upper side of the polarizing plate. The window film may be the window film described above in connection with any one of FIGS. 1 through 4. The substrate may include flexible and transparent materials. In addition, the member for apparatuses is a display device such as an organic light emitting diode or liquid crystal, and may be a flexible display device.

Figure 5:
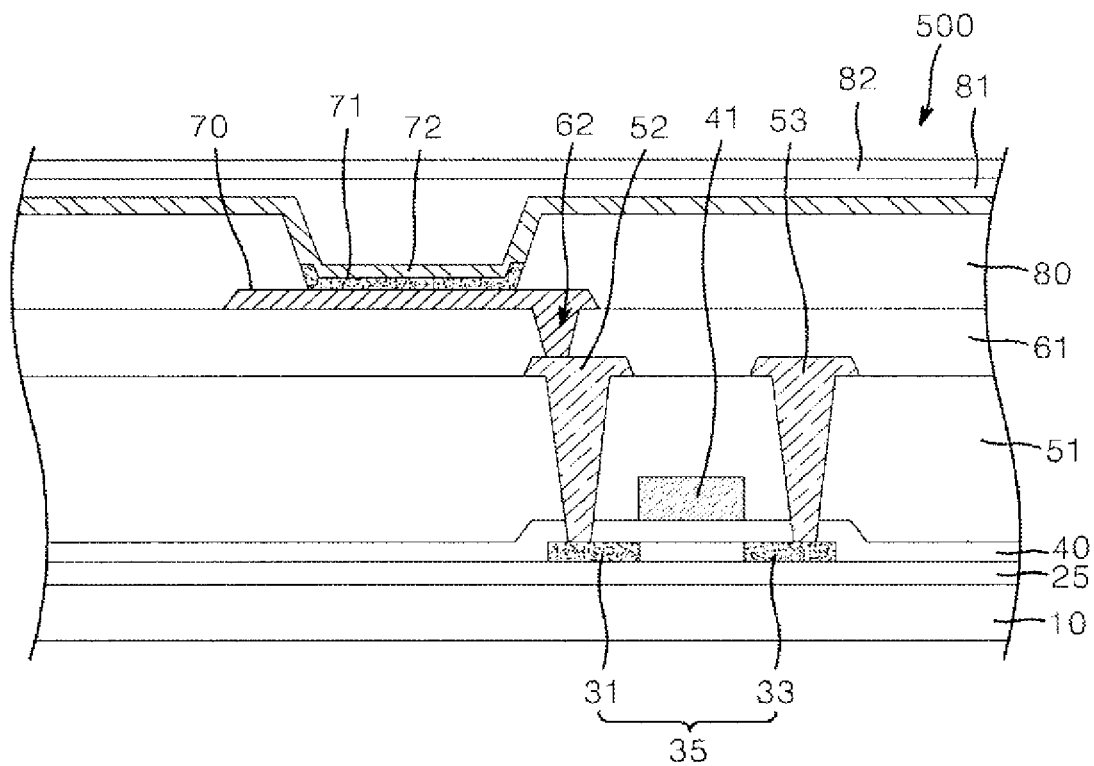
FIG. 5 is a partial cross-sectional view of a display according to embodiments of the present invention.

Hereinafter, an organic light emitting diode display according to embodiments of the present invention is described with reference to FIG. 5. FIG. 5 is a partial cross-sectional view of an organic light emitting diode display according to embodiments of the present invention.

Referring to FIG. 5, an organic light emitting diode display 500 according to embodiments of the invention may include: a substrate 10; a buffer layer 25 formed on an upper side of the substrate 10; a gate electrode 41 formed on an upper side of the buffer layer 25; and a gate insulating layer 40 formed between the gate electrode 41 and the buffer layer 25. An active layer 35 including source and drain regions 31, 33 is formed in the gate insulating layer 40. An interlayer insulating layer 51, through which source and drain electrodes 52, 53 are formed, is formed on an upper side of the gate insulating layer 40, and a passivation layer 61 including a contact hole 62, a first electrode 70 and a pixel layer 80 are formed on an upper side of the interlayer insulating layer 51. An organic light emitting layer 71 and a second electrode 72 are formed on an upper side of the pixel layer 80; an encapsulation layer 81 is formed on an upper side of the second electrode 72; and a window film 82 is formed on an upper side of the encapsulation layer 81. The window film 82 may include the window film described above in connection with any one of FIGS. 1 through 4.

Hereinafter, embodiments of the present invention are described with reference to some examples. However, it is understood that these examples are provided for illustration only and are not to be construed in any way as limiting the present invention.

EXAMPLE 1

70.00 g of a mixture comprising a siloxane resin containing a UV curable group (epoxy hybrimer, Solip Co., Ltd., solid content: 90 wt %) and 30.00 g of methylethylketone were mixed, followed by introduction of 0.02 g of a porphyrin dye, PD-311S (Yamamoto Chemicals Co., Ltd., maximum absorption wavelength:584 nm). The mixture was stirred for 30 minutes and then degassing for 30 minutes, thereby preparing a composition for a coating layer. The mixture comprising the siloxane resin containing the UV curable group was a mixture of a silicone resin, an epoxy monomer and a photocationic initiator.

The composition for the coating layer was coated onto a transparent polyimide film (thickness:75 μm) using a bar coating applicator, followed by drying in an oven at 80° C. for 3 minutes, and exposure to UV at a dose of 500 mJ/cm². The composition for the coating layer was subjected to post-curing at 120° C. for 24 hours, thereby manufacturing a window film including a coating layer (thickness:50 μm) and the polyimide film (thickness:75 μm).

EXAMPLE 2

A window film was manufactured as in Example 1, except that 0.02 g of a porphyrin dye, PD-349 (Yamamoto Chemicals Co., Ltd., maximum absorption wavelength: 592 nm), was used instead of 0.02 g of PD-311S (Yamamoto Chemicals Co., Ltd.).

EXAMPLE 3

A window film was manufactured as in Example 1, except that 0.02 g of a vanadium dye, SK-D593 (SK Chemicals Co., Ltd., maximum absorption wavelength:593 nm), was used instead of 0.02 g of PD-311S (Yamamoto Chemicals Co., Ltd.).

EXAMPLE 4

A window film was manufactured as in Example 1, except that 0.02 g of a tetraazaporphyrin dye, SK-D584 (SK Chemicals Co., Ltd., maximum absorption wavelength:584 nm), was used instead of 0.02 g of PD-311S (Yamamoto Chemicals Co., Ltd.).

EXAMPLE 5

A window film was manufactured as in Example 1, except that 0.02 g of PANAX NEC 595 (Ukseung Chemical Co., Ltd., maximum absorption wavelength:595 nm), corresponding to a mixed dye of a tetraazaporphyrin dye and a vanadium dye, was used instead of 0.02 g of PD-311S (Yamamoto Chemicals Co., Ltd.).

EXAMPLE 6

70.00 g of a mixture comprising a siloxane resin containing a UV curable group (epoxy hybrimer, Solip Co., Ltd., solid content:90 wt %) and 30.00 g of methylethylketone were mixed, followed by stirring for 30 minutes and then degassing for 30 minutes, thereby preparing a composition for a coating layer. The mixture comprising the siloxane resin containing a UV curable group was a mixture of a silicone resin, an epoxy monomer and a photocationic initiator.

100 g of a (meth)acrylic resin (prepared by polymerization of a mixture of 50 wt % of ethylhexyl acrylate, 30 wt % of isobornyl acrylate, 10 wt % of hydroxyethyl acrylate and 10 wt % of acrylic acid), 0.1 g of 1,6-hexanediol diacrylate as a crosslinking agent, 0.1 g of a silane coupling agent, KBM-403 (ShinEtsu Co., Ltd.), and 0.02 g of a porphyrin dye, PD-3115 (Yamamoto Chemicals Co., Ltd., maximum absorption wavelength: 584 nm) were mixed, thereby preparing a composition for an adhesive layer.

The composition for the coating layer was coated onto one surface of a transparent polyimide film (thickness:75 μm) using a bar coating applicator, and the composition for the adhesive layer was coated onto the other surface of the polyimide film using a bar coating applicator, followed by drying in an oven at 80° C. for 3 minutes and exposure to UV at a dose of 500 mJ/cm². The compositions were subjected to post-curing at 120° C. for 24 hours, thereby manufacturing a window film including a coating layer (thickness:50 μm), the polyimide film (thickness:75 μm), and an adhesive layer (thickness:20 μm).

COMPARATIVE EXAMPLE 1

70.00 g of a mixture comprising a siloxane resin containing a UV curable group (epoxy hybrimer, Solip Co., Ltd., solid content:90 w t%) and 30.00 g of methylethylketone were mixed, followed by stirring for 30 minutes and then degassing for 30 minutes, thereby preparing a composition for a coating layer. The mixture comprising the siloxane resin containing the UV curable group was a mixture of a silicone resin, an epoxy monomer and a photocationic initiator.

The composition for the coating layer was coated onto a transparent polyimide film (thickness:75 μm) using a bar coating applicator, followed by drying in an oven at 80° C. for 3 minutes, and then exposure to UV at a dose of 500 mJ/cm². The composition for the coating layer was subjected to post-curing at 120° C. for 24 hours, thereby manufacturing a window film including a coating layer (thickness:50 μm) and the polyimide film (thickness:75 μm).

COMPARATIVE EXAMPLE 2

A window film was manufactured as in Example 1, except that 0.02 g of a diazonium dye, LUMAPLAST BLU RR (M. Dohmen Co., Ltd., maximum absorption wavelength:431 nm), was used instead of 0.02 g of PD-311S (Yamamoto Chemicals Co., Ltd., maximum absorption wavelength: 584 nm).

COMPARATIVE EXAMPLE 3

A window film was manufactured as in Example 1, except that 0.02 g of a phthalocyanine dye, PANAX 880 (Ukseung Chemical Co., Ltd., maximum absorption wavelength:880 nm), was used instead of 0.02 g of PD-311S (Yamamoto Chemicals Co., Ltd., maximum absorption wavelength: 584 nm).

Each of the window films of the Examples and Comparative Examples was evaluated as to the properties listed in Table 1.

TABLE 1

| Property | Comp. Example 1 | Comp. Example 2 | Comp. Example 3 | Ex. 1 | Ex. 2 | Ex. 3 | Ex. 4 | Ex. 5 | Ex. 6 |
|---|---|---|---|---|---|---|---|---|---|
| Maximum absorption wavelength of dye (nm) | — | 431 | 880 | 584 | 592 | 593 | 584 | 595 | 584 |
| Pencil hardness | 8 H | 8 H | 8 H | 8 H | 8 H | 8 H | 8 H | 8 H | 8 H |
| Haze (%) | 1.94 | 1.09 | 1.35 | 1.08 | 0.98 | 0.99 | 1.10 | 1.01 | 1.11 |
| Total light transmittance (%) | 88.94 | 88.29 | 85.13 | 88.31 | 88.27 | 88.42 | 88.39 | 88.19 | 88.43 |
| Yellowness index | 7.36 | 10.89 | 7.16 | 1.86 | 2.58 | 3.18 | 2.32 | 1.54 | 1.92 |
| Radius of curvature (tensile direction, mm) | 10 | 10 | 10 | 10 | 10 | 10 | 10 | 10 | 10 |
| Radius of curvature (compressive direction, mm) | 5 | 5 | 5 | 5 | 5 | 5 | 5 | 5 | 5 |

As shown in Table 1, the window films according to embodiments of the present invention had high pencil hardness, were transparent, exhibited flexibility due to low radii of curvature, and could prevent (or reduce) visible yellowing due to a lower yellowness index than the yellowness indices of the window films of the Comparative Examples.

Therefore, the window films according to embodiments of the present invention have low yellowness indices and can minimize (or reduce) the phenomenon in which a yellow color is visible at the front and/or lateral sides of the window film. In addition, since the window films according to embodiments of the present invention have high hardness, are transparent and exhibit flexibility, the window films can be used in flexible apparatuses.

On the other hand, although the window film of Comparative Example 1 (not including a dye) had high pencil hardness, was transparent and exhibited flexibility due to a low radius of curvature, the window film of Comparative Example had a higher yellowness index than the window films according to embodiments of the present invention, and thus exhibited visible yellowing.

(1) Pencil hardness: Pencil hardness was measured on the coating layer of the window film using a HEIDON-14EW apparatus (SHINTO Scientific Co., Ltd.). When pencil hardness was measured, pencils (available from MITSUBISH Co., Ltd.) were used, and the measurement was performed at a speed of 60 mm/min, a scale of 10.0 mm, a force of 19.6N, a load of 1 kg, and an angle of 45° between the pencil and the coating layer. After pencil hardness was repeatedly measured five times using pencils having the same hardness, the maximum pencil hardness that did not allow scratches to be observed on the coating layer was taken as the pencil hardness measurement.

(2) Haze and Total light transmittance: The haze and total light transmittance of the window film were measured at a wavelength of 380 nm to 750 nm using aNDH2000 (NIPPON DENSHOKU Co., Ltd.).

(3) Yellowness index: The yellowness index of the window film was measured using a CM-3600d (KONICAMINOLTA Co., Ltd.). Upon measurement, a D65.2° light source was employed and a yellowness index 1925 [Recal] value was adopted.

(4) Radius of curvature: A specimen was prepared by cutting the window film to a size of 3 cm×15 cm (width× length). The specimen was wound around a jig for radius of curvature tests (mandrel bending tester, Coretech Co., Ltd.), and kept wound for 5 seconds. The specimen was unwound and observed using an optical microscope to determine whether the specimen suffered from cracking. After the measurement was repeated while the radius of the jig was changed from 1 mm to 50 mm, the minimum radius at which the specimen did not crack was taken as the radius of curvature. The radius of curvature in the compressive direction was obtained when the measurement was performed such that the coating layer of the window film was brought into contact with a surface of the jig. The radius of curvature in the tensile direction was obtained when the measurement was performed such that the base layer of the window film was brought into contact with the jig.

While certain exemplary embodiments of the present invention have been illustrated and described, it is understood that various modifications, changes and alterations can be made to the described embodiments without departing from the spirit and scope of the invention, as defined in the following claims.

What is claimed is:

1. A window film, comprising:
   a base layer, the base layer being a polyimide resin film having a yellowness index of 5 or greater; and
   a coating layer on the base layer, the coating layer comprising a silicone resin containing a UV curable group,
   the window film containing a dye having a maximum absorption wavelength of about 500 nm to about 650 nm, the dye comprising at least one of a porphyrin dye, an arylmethane dye, a squarylium dye, an azomethine dye, an oxonol dye, an azo dye, an arylidene dye, a xanthene dye, a vanadium dye, or a merocyanine dye,
   wherein the window film has an overall yellowness index of about 4.0 or lower, a pencil hardness measured on the coating layer of the window film is about 6H or higher, and a thickness ratio of the base layer to the coating layer is about 1:1 to about 5:1.

2. The window film according to claim 1, wherein the dye has a maximum absorption wavelength of about 550 nm to about 620 nm.

3. The window film according to claim 1, wherein the dye is contained in at least one of the base layer or the coating layer.

4. The window film according to claim 1, further comprising an adhesive layer on the base layer.

5. The window film according to claim 4, wherein the dye is contained in the adhesive layer.

6. The window film according to claim 1, wherein the coating layer has a pencil hardness of about 6H to about 9H.

7. The window film according to claim 1, wherein the dye is present in an amount of about 0.001 wt % to about 5 wt % based on 100 wt % of the coating layer.

8. The window film according to claim 1, wherein the coating layer is formed from a composition for a coating layer comprising the dye, the silicone resin, a curable monomer and an initiator.

9. The window film according to claim 8, wherein the curable monomer comprises at least one of an epoxy monomer, an acid anhydride monomer, or an oxetane monomer.

10. A display, comprising the window film according to claim 1.

11. The display according to claim 10, wherein the display is a flexible display.

* * * * *